United States Patent
Liao et al.

(10) Patent No.: US 6,219,171 B1
(45) Date of Patent: Apr. 17, 2001

(54) APPARATUS AND METHOD FOR STEPPER EXPOSURE CONTROL IN PHOTOGRAPHY

(75) Inventors: Yong-Shun Liao, Un-Lin; Wen-Jye Chung, Hsin-Chu, both of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/325,447

(22) Filed: Jun. 3, 1999

(51) Int. Cl.[7] .................................................. G02F 1/03
(52) U.S. Cl. ..................... 359/250; 359/245; 359/246; 359/254
(58) Field of Search .................................. 359/245, 280, 359/246, 251, 254, 319, 320, 322

(56) References Cited

U.S. PATENT DOCUMENTS 6,072,629 * 6/2000 Fan ......................................... 359/497

* cited by examiner

Primary Examiner—Georgia Epps
Assistant Examiner—Michael A. Lucas
(74) Attorney, Agent, or Firm—Tung & Associates

(57) ABSTRACT

An apparatus and a method for stepper exposure control by utilizing a shutter assembly formed of electro-optic crystal materials in a photolithographic process are disclosed. In the apparatus, a series of control panels are stacked together to form a shutter assembly. Each of the control panel is formed by depositing a multiplicity of parallel, spaced-apart lines of electro-optic crystal material on a polarizer sheet. Two of such polarizer sheets are then stacked together with the lines parallel to each other and the lines on the top panel overlapping the spacing on the bottom panel. Two bottom panels are formed similarly however, positioned with the lines perpendicular to the lines in the first and second control panel when assembled together in the shutter assembly. A suitable electro-optic crystal material used should withstand a high temperature environment. One of such suitable material is $LiNbO_3$. The control panels can also be formed by embedding the electro-optic crystal material in a polarizer material layer and then depositing a transparent, insulative material such as $SiO_2$ on top for protection and insulation.

22 Claims, 2 Drawing Sheets

APPARATUS AND METHOD FOR STEPPER EXPOSURE CONTROL IN PHOTOGRAPHY

FIELD OF THE INVENTION

The present invention generally relates to an apparatus and a method for controlling light transmission and more particularly, relates to an apparatus and a method for controlling light transmission in a stepper exposure process during photolithography by utilizing electro-optic crystal coatings on polarizer sheets.

BACKGROUND OF THE INVENTION

Modern fabrication processes for producing semiconductor devices, such as integrated circuits, have long employed photolithography for transferring circuit patterns onto a semiconductor substrate, such as a wafer. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography stepper apparatus, sometimes referred to as a "step and repeat" or "stepper", is typically used to expose the resist layer. An image of each layer of an IC die is formed on a small rectangular piece of glass referred to as a reticle or mask. The mask or reticle is placed on the stepper and a reduced image thereof is projected onto a portion of the resist layer covering the semiconductor wafer. Specifically, the reticle patterns are transferred to the wafer by scanning the patterns through a narrow illumination slit.

When numerous IC's are to be fabricated from a single wafer, a mask used in the fabrication of any one IC is also used in the fabrication of the other IC's from the wafer. This is accomplished by using the stepper to index or "step" the wafer under an optical system which includes the mask or reticle. At each step, the photoresist is exposed to the optical system, typically with ultraviolet light, to form an aerial image of the mask on the layer of photoresist. The wafer is then removed from the stepper and the image is developed. At that point, the wafer is etched to remove portions of the underlying film, following which the wafer is ready for the next stage of processing, which might include for example, ion implantation, deposition or other types of etching processes. At a later stage in the fabrication process, the wafer is returned to the stepper for exposure of the wafer to a different mask.

The reticle or mask is composed of a glass substrate, such as quartz, on which there is formed a circuit pattern composed of materials such as chromium which prevents ultraviolet light from transmitting therethrough. The reticle is set in the stepper in order to expose a semiconductor wafer to light, and the circuit pattern formed on the reticle is imaged by the stepper onto the semiconductor substrate.

Semiconductor manufacturing processes are aimed at achieving up to 0.25 micron resolution in a high production environment. This goal is being driven by the need to develop competitive device performance and lower manufacturing costs per device. In order to increase the field size and improve critical dimensional control below 0.25 micron resolution, improvements in step and repeat technology will play a critical role. Improvements in the area of highly controllable, precise light sources, such as excimer lasers with appropriate dose control are important for solving illumination control problems and achieving exceptionally short exposure times.

In order to more precisely control the dose of light radiation projected on the wafer, the illumination system and scanner slit have, in the past, been provided with an adjustment that allows focusing of the image applied to the wafer. This adjustment system relies on movement and adjustment of mechanical elements, and particularly the displacement of the mechanical slit relative to the illumination source. As a result of the dependency on this mechanical adjustment, repeatable results are not always obtained from batch to batch since adjustment settings may change for a number of reasons. Moreover, the need to perform periodic preventive maintenance on equipment introduces the further possibility that adjustment settings may be inadvertently altered, thus making repeatable, precise dosage control impossible.

A typical step-and-repeat projection system carried out in a stepper is shown in FIG. 1. In the projection system 10, the image size is projected at 1:1 or reduced in size by 2× to 5×. Reducing the image size provides the benefit that the features on the reticle do not have to be as small as the final image and are therefore substantially easier to fabricate. Another benefit is that mask defects and imperfections are also reduced in size and thus become less severe. However, as the wafer size increases, i.e., to 200 mm or larger, it becomes impossible to design optical components that can project a mask over an entire wafer. Instead, refractive optical systems are designed to project an image over a small portion of the wafer and then step-and-repeat the complete wafer surface. In a typical projection system 10, an excimer laser or a high intensity mercury source 12 is used as the light source which is reflected by a mirror 14 onto a filter 16 and a condenser lens 18. The condenser lens 18 (or the collimating lens) focus the illumination on a reticle or mask 22, and then on a reduction lens 52 to image the mask onto the surface of a wafer 54. After each exposure, the wafer is mechanically stepped a predetermined distance, realigned and refocused before the image is projected again in the step-and-repeat manner.

Referring now to FIG. 2 which depict a prior art photolithography illumination system and related dosage control technique. Radiation in the form of ultraviolet light is produced by a lamp 20 and is focused by a reflector 24 onto a reflecting mirror 26 to produce a beam of light which is sequentially passed through a filter 28, shutter 30, attenuator 32, zoom lens 34, interference filters 36, integrator lens 38 and field lens 40 onto an aluminized mirror 44. A portion of the beam focused onto the mirror 44 passes therethrough onto an energy sensor 46 which measures the intensity of the beam. The remainder of the beam is reflected by the mirror 44 as a beam spot 48 which is directed through reticle masking blades 50 defining a slit 51 thence through a reticle or mask (not shown). Radiation in the beam passes through the slit 51 and circuit pattern defining reticle and is focused onto a semiconductor wafer 54 that is supported on an exposure chuck 52 provided with a spot meter 56 for measuring the intensity of the beam focused onto a portion of the wafer 54.

The shutter 30 in FIG. 2 provides for exposure control by allowing a predetermined amount of UV light onto the photomask and thus producing an image on the wafer. Conventionally, the shutter is a mechanical device which is not only too slow to control, but also inaccurate in achieving precision control. For instance, the best accuracy that can be obtained by a mechanical shutter device is about 0.5 mm which is insufficient for exposure control in producing high density devices.

It is therefore an object of the present invention to provide an apparatus for controlling light transmission that does not have the drawbacks or shortcomings of a conventional shutter.

It is another object of the present invention to provide an apparatus for controlling light transmission in stepper exposure for a photolithographic process.

It is a further object of the present invention to provide an apparatus for stepper exposure control by utilizing a shutter that operates electronically.

It is another further object of the present invention to provide an apparatus for stepper exposure control in a photolithographic process that utilizes electro-optic crystal materials.

It is still another object of the present invention to provide an apparatus for stepper exposure control in a photolithographic process by utilizing four layers of electro-optic crystal materials wherein two layers are arranged in a parallel direction and two layers are arranged in a perpendicular direction.

It is yet another object of the present invention to provide an apparatus for stepper exposure control in a photolithographic process by utilizing shutters formed of $LiNbO_3$ electro-optic crystal.

It is still another further object of the present invention to provide a shutter for exposure control in a stepper used in photolithography that includes light transmission control units which are formed of a multiplicity of parallel, spaced-apart lines of an electro-optic crystal embedded in a polarizer material on a quartz plate.

It is yet another further object of the present invention to provide a method for controlling light transmission by first providing a shutter formed of an electro-optic crystal material that stops light transmittance when the crystal material is charged with electricity.

SUMMARY OF THE INVENTION

In accordance with the present invention, an apparatus and a method for stepper exposure control in a photolithography process are provided.

In a preferred embodiment, an apparatus for controlling light transmission is provided which includes a first polarizer sheet, a first multiplicity of parallel, spaced-apart lines formed of an electro-optic crystal material on the first polarizer sheet, the lines have a pre-set spacing of "X" thereinbetween, a second polarizer sheet on top of the first multiplicity of parallel, spaced-apart lines, a second multiplicity of parallel, spaced-apart lines formed of an electro-optic crystal material on the second polarizer sheet substantially parallel to and overlapping the spacing "X" of the first multiplicity of lines, a third polarizer sheet on top of the second multiplicity of lines, a third multiplicity of parallel, spaced-apart lines formed of an electro-optic material and in a perpendicular direction to the first and second plurality of lines on the third polarizer sheet, the third multiplicity of lines has a pre-set spacing of "Y" thereinbetween, a fourth polarizer sheet on top of the third multiplicity of lines, a fourth multiplicity of parallel, spaced-apart lines formed of an electro-optic material on the fourth polarizer sheet substantially parallel to and overlapping the spacing of "Y" of the third multiplicity of parallel, spaced-apart lines, and a transparent, electrically insulative material embedding the fourth multiplicity of parallel, spaced-apart lines.

The apparatus for controlling light transmission may further include a transparent, electrically insulative material embedding each of the first, second and third multiplicity of parallel, spaced-apart lines. The transparent, electrically insulative material may be $SiO_2$. The apparatus may further include wiring means for providing electrical communication with each of the first, second, third and fourth multiplicity of parallel, spaced-apart lines, or further include wiring means, power supply and logic control means which form a main grating unit for a stepper. The electro-optic crystal material may include $LiNbO_3$.

In the apparatus for controlling light transmission, a width of the first and second multiplicity of parallel, spaced-apart lines may be larger than the "X" spacing, or may be larger than the "X" spacing by at least 10% "x". A width of the third and fourth multiplicity of parallel, spaced-apart lines may be larger than the "Y" spacing, or may be larger than the "Y" spacing by at least 10% "Y". A total planar surface area formed by the first multiplicity of parallel, spaced-apart lines may be between about 1 mm×1 mm and about 100 mm×100 mm. The width of the first, second, third and fourth multiplicity of parallel, spaced apart lines may be between about 1 $\mu$m and about 100 $\mu$m. Each of the first, second, third and fourth multiplicity of parallel, spaced-apart lines is controlled by an independent logic circuit. The first, second, third and fourth multiplicity of parallel, spaced-apart lines may be embedded in a polarizer material layer deposited on a quartz plate.

In another preferred embodiment, a shutter for exposure control in a stepper used in a photolithographic process is provided which includes a light transmission control unit formed by a multiplicity of parallel, spaced-apart lines of an electro-optic crystal embedded in a polarizer material layer deposited on a quartz plate, and an exposure control shutter formed by four light transmission control units stacked together in an up-and-down configuration, the top two control units are stacked in such a way that the multiplicity of parallel, spaced-apart lines in a top-most control unit overlaps spacings between the multiplicity of parallel, spaced-apart lines in a second control unit positioned below the top-most control unit, the bottom two control units are stacked in such a way that the multiplicity of parallel, spaced-apart lines are perpendicular to the multiplicity of parallel, spaced-apart lines in the top two control units, and the multiplicity of parallel, spaced-apart lines in a third control unit overlaps spacings between the multiplicity of parallel, spaced-apart lines in a fourth control unit.

In the shutter for exposure control in a stepper, the electro-optic crystal utilized may include $LiNbO_3$. The multiplicity of parallel, spaced-apart lines may have a width that is larger than a width of the spacings, or larger than a width of the spacings by at least 10% of the spacing width. The shutter may further include electrical wiring means, power supply means and logic control means. The multiplicity of parallel, spaced-apart lines each may have a width between about 1 mm and about 100 mm.

The present invention is further directed to a method for controlling light transmission which can be carried out by the operating steps of first providing a shutter formed by a first polarizer sheet, a first multiplicity of parallel, spaced-apart lines formed of an electro-optic crystal material on the first polarizer sheet, the lines having a pre-set spacing of "X" thereinbetween, a second polarizer sheet on top of the first multiplicity of parallel, spaced-apart lines, a second multiplicity of parallel, spaced-apart lines formed of an electro-optic crystal material on the second polarizer sheet substantially parallel to and overlapping the spacing "X" of the first multiplicity of lines, a third polarizer sheet on top of the second multiplicity of lines, a third multiplicity of parallel, spaced-apart lines formed of an electro-optic material and in a perpendicular direction to the first and second multiplicity of lines on the third polarizer sheet, the third multiplicity of line shaving a pre-set spacing of "Y" thereinbetween, a fourth polarizer sheet on top of the third multiplicity of lines, a fourth multiplicity of parallel, spaced-apart lines formed of an electro-optic material on the fourth polarizer sheet substantially parallel to and overlapping the spacing of "Y" of the third multiplicity of parallel, spaced-apart lines, and a transparent, electrically insulative material embedding the fourth multiplicity of parallel, spaced-apart lines, electrically connecting the first, second, third and fourth plurality of parallel, spaced-apart lines to a power supply and a logic control unit, and inputting electrical power to the first, second, third and fourth multiplicity of parallel, spaced-apart lines for controlling light transmission through the shutter.

The method for controlling light transmission may further include the step of forming the first, second, third and fourth multiplicity of parallel, spaced-apart lines in $LiNbO_3$ to a width between about 1 μm and about 100 μm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for stepper exposure control in a photolithographic process by utilizing a shutter that is constructed substantially of an electro-optic crystal material. One of such suitable electro-optic crystal materials utilized in the present invention is $LiNbO_3$. The electro-optic crystal material can be suitably coated on a polarizer sheet, or can be embedded in a polarizer material by utilizing a standard photolithographic process for fabricating semiconductor devices.

The present invention novel shutter device for stepper exposure control can be advantageously made by forming units of electro-optic crystal material on polarizer sheets and then stacking four of such sheets together forming a shutter assembly. The top two sheets are stacked together such that the multiplicity of electro-optic crystal material formed lines are in a parallel direction while the lines on one sheet overlaps the spacing on the other sheet. The bottom two units are constructed such that the multiplicity of parallel, spaced-apart lines are arranged in a perpendicular direction with lines on one sheet overlapping the spacing on the other sheet. The multiplicity of parallel, spaced-apart lines in all four units are connected by electrical wiring to a power supply and a logic circuit controller. Each layer of the shutter assembly is controlled by an independent logic circuit such that when power is supplied to the electro-optic crystal material, light can not transmit through the crystal material and thus the light intensity allowed through the shutter device is reduced. The electro-optic crystal material may also be selected and arranged such that when power is supplied to the material, light goes through the unit light control panel formed of the multiplicity of lines of the electro-optic crystal material on a polarizer sheet. However, it is more advantageous to arrange and select the crystal material such that when power is not supplied to the control panel, light goes through the shutter assembly for use in a normal exposure process in photolithography.

In the preferred embodiment shown below, a multiplicity of parallel, spaced-apart lines formed of electro-optic crystal material are formed on a polarizer sheet, a transparent, electrically insulative material such as $SiO_2$ is then deposited to embed the multiplicity of lines to provide protection and insulation. Any other suitable dielectric materials other than $SiO_2$ may also be used for such purpose.

Figure 1:
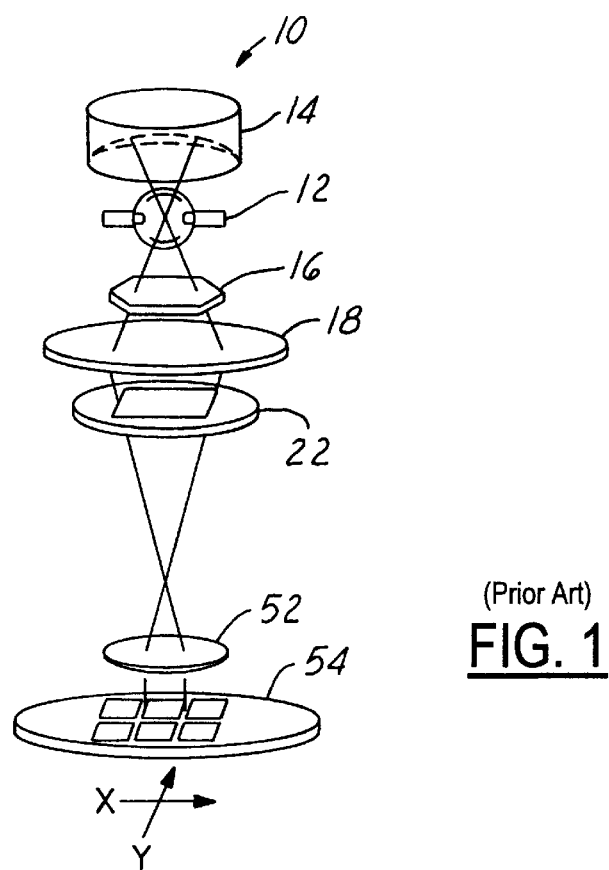
FIG. 1 is a schematic illustrating a conventional exposure system utilized in a stepper.
Figure 2:
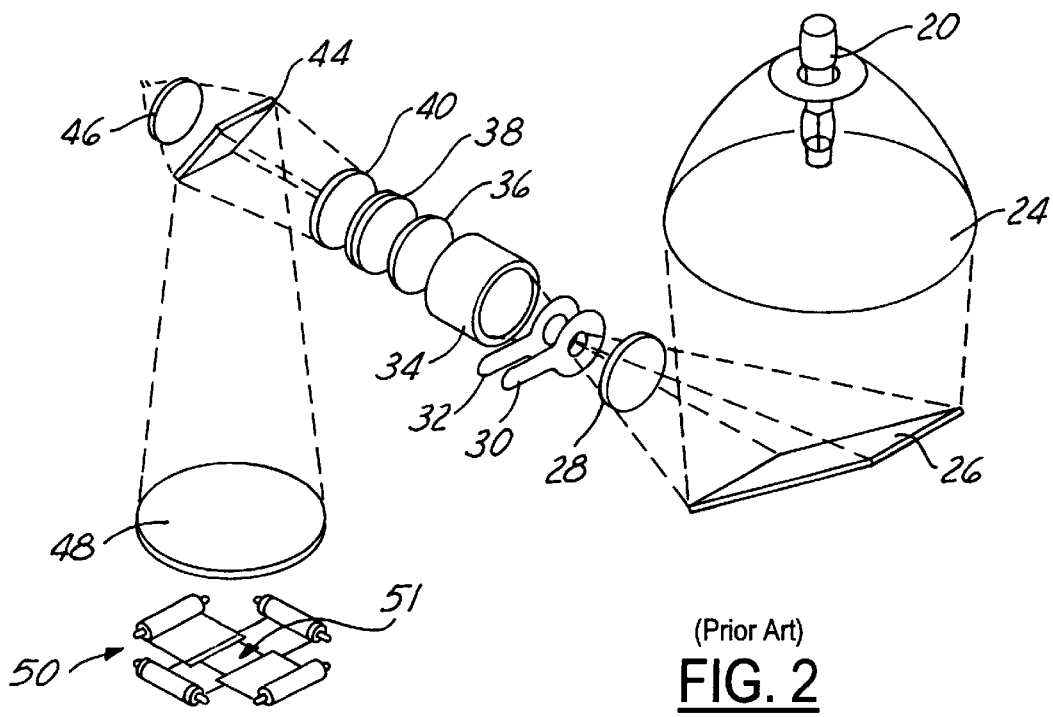
FIG. 2 is a perspective view of a conventional exposure system utilized in a stepper.
Figure 3:
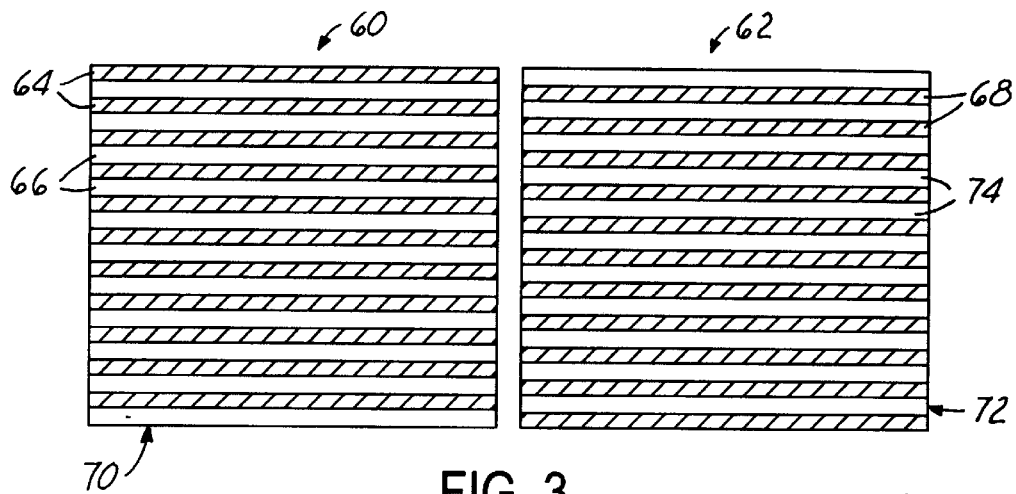
FIG. 3 is a plane view of two adjacent layers of electro-optic crystal material arranged in parallel, spaced-apart lines.

Referring now to FIG. 3, wherein an enlarged, plane view of the top two light transmission control panels 60, 62 for a shutter assembly 70 (shown in FIG. 4A, 4B) are shown. In control panel 60, a multiplicity of parallel, spaced-apart lines 64 are formed of an electro-optic crystal material. One of the suitable electro-optic crystal material is $LiNbO_3$. The spacing 66 between the lines 64 may have a width in the range between about 1 μm and about 100 μm, preferably between about 1 μm and about 20 μm, and more preferably between about 5 μm and about 15 μm. The width of the lines 64 should always be slightly larger than the width of the spacing 66. For instance, the width of the multiplicity of lines (or rods) 64 may be about 11 μm, while the width of the spacing 66 may be about 9 μm. As illustrated in FIG. 3, the line width is approximately 10% larger than the spacing width. In order for the electro-optic crystal material to effectively block light transmission, the line width should always be slightly larger than the spacing width.

The multiplicity of parallel/spaced-apart lines 64 can be suitably formed on an underlying sheet of a polarizer material, i.e., sheet 70 forming the top-most control panel for light transmission. On the right hand side of FIG. 3, the second control panel 62 for light transmission is shown. Control panel 62 is constructed similarly to control panel 60 by a multiplicity of parallel, spaced-apart electro-optic crystal material lines 68 formed on the polarizer sheet 72. The spacing 74 between the multiplicity of parallel, spaced-apart lines 68 separates the lines 68. It should be noted that in a shutter assembly which is formed by stacking together control panel 60 and control panel 62 parallelly, the first multiplicity of electro-optic lines 64 lies directly over the spacing 74 in the control panel 62 such that all the light transmitted through a top surface of control panel 60 can be either blocked or transmitted through. After the multiplicity of parallel, spaced-apart electro-optic crystal lines are formed on the polarizer sheet 70, a dielectric material such as a transparent, insulating material of $SiO_2$ may be suitably used to deposit over the panel 60 such that the electro-optic crystal lines are protected and insulated from the environment. This is shown in FIG. 4A, wherein a dielectric material 76 of $SiO_2$ has been formed over the multiplicity of lines 64.

Figure 4A:
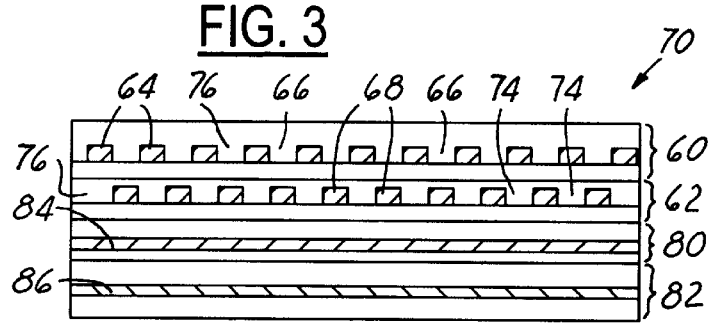
FIG. 4A is an enlarged, cross-sectional view of the present invention shutter device.

FIG. 4A shows the bottom two control panels 80 and 82 which were not shown in FIG. 3. The bottom two control panels 80, 82 are formed in a similar way as the top two control panels 60, 62 with the lines on the top panel 80 formed overlapping the spacings in the bottom panel 82. The major difference is that when the bottom two panels are assembled with the top two panels forming a shutter assembly 70, the multiplicity of electro-optic crystal lines 84, 86 are positioned in a perpendicular direction to the first and second multiplicity of lines 64, 68. This enables light to be completely blocked when passing through the shutter assembly 70 when the crystal material is energized by a power supply. Since each individual control panel is controlled by an independent logic circuit, a controller may be used for feeding power to a specific section of the control panel such that a desirable exposure pattern in the shutter assembly can be suitably selected, i.e., any area in the shutter assembly can be made light transmissive or light non-transmissive. The present invention novel electronic shutter device therefore does not require mechanical movement in achieving the opening or closing of shutters. This is a major advantage made possible by the present invention apparatus.

Figure 4B:
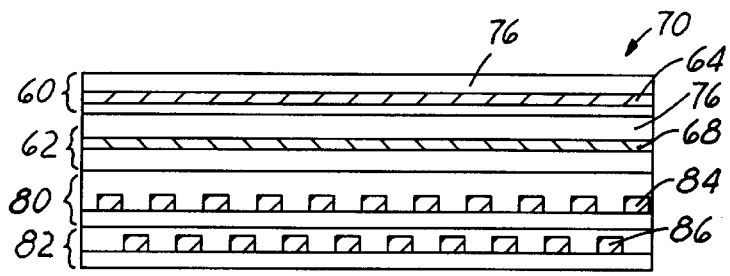
FIG. 4B is an enlarged, cross-sectional view of the present invention shutter device taken in a direction perpendicular to that shown in FIG. 4A.

FIG. 4B is an enlarged, cross-sectional view of the present invention novel shutter assembly 70 taken in a perpendicular direction from that shown in FIG. 4A.

The structure shown in FIGS. 4A and 4B is therefore an array of polarized switch rod that is constructed in the form of control panels 60, 62, 80, 82. In the implementation example shown in FIGS. 3–4B, the shutter assembly 70 has a total cross-sectional area of about 22 mm×22 mm, while the line width is about 11 $\mu$m and the spacing width is about 9 $\mu$m, i.e., the line width is about 10% wider than the spacing width. The top two control panels 60, 62 are aligned in an "X" direction, while the bottom two control panels 80, 82 are aligned in a "Y" direction.

The electro-optic crystal material selected, i.e., $LiNbO_3$ can withstand a high temperature service environment. By controlling the voltage inputted to the electro-optic crystal material, one can change the polarized direction of the polarized light when it passes through the crystal material. Behind the electro-optic crystal material, a polarized sheet is utilized which stops the light with different polarized direction. Utilizing this principle, the shutter assembly can be used effectively to control light transmitted therethrough. Therefore, the exposure area or the exposure energy on a water surface can be precisely controlled by the electrical shutter of the present invention.

The use of a high temperature endurant $LiNbO_3$ is important since the light source of either a mercury light or an excimer laser light generates a large amount of heat during the exposure process. The shutter assembly therefore must withstand such high temperature environment.

The present invention novel structure can be fabricated by any semiconductor fabrication techniques. For instance, in a typical fabrication process, the electro-optic crystal material may first be evaporated on top of a transparent substrate. A photolithographic etching process can then be used to etch away trenches in the electro-optic crystal material layer. This photolithographic etching process can be easily conducted since the dimensions involved are in $\mu$m range. A transparent, insulative dielectric material layer such as $SiO_2$ is then deposited on top of the electro-optic crystal layer. The above processing steps produce a single control panel which can then be repeated to produce three other panels that are stacked on top of the first panel formed.

Figure 5:
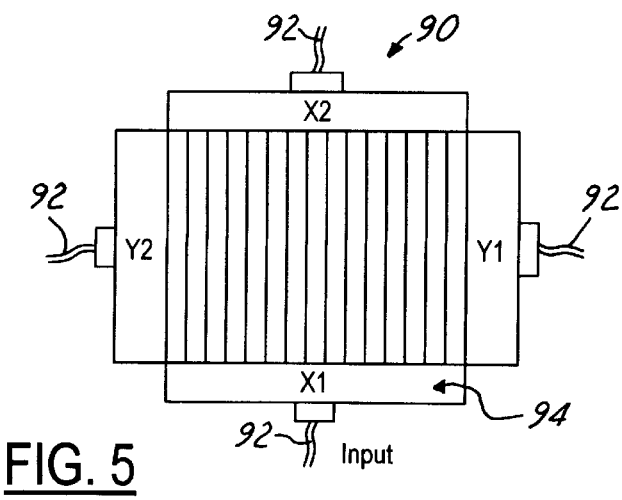
FIG. 5 is a plane view of the present invention shutter device after electrical wiring, power supply and logic control means are connected forming an assembly.

In the final stage of the process, as shown in FIG. 5, electrical connections are made to the individual control panels. A logic control circuit may be used to input data into the various control panels and to change the light transparency of the electro-optic crystals. For instance, if one third of the intensity is required in an exposure process, only one third of the electro-optic crystal material are left intact while the other two thirds are inputted with electric power in order to make them non-transmissive to light. An excimer laser source or a mercury light source can be operated at approximately 2200 mJ for producing UV light or deep UV light. When the excimer laser emission is not transmitted through the control panel, i.e., it is either absorbed or reflected, a large amount of heat is generated in the control panel. The use of a high temperature electro-optic material such as $LiNbO_3$ is therefore desirable. Liquid crystal materials cannot be used since they can not withstand high temperature environment.

As shown in FIG. 5, a completely assembled shutter assembly (or a main grating unit) 90 is assembled with an electrical wiring 92 and a power supply and logic control unit 94 wherein each of the four control panels are controlled by an independent logic control circuit.

The present invention novel apparatus for controlling light transmission in stepper exposure control for a photolithographic process and a method for using such apparatus have therefore been amply described in the above descriptions and in the appended drawings of FIGS. 3–5.

While the present invention has been described in an illustrative manner, it should be understood that the terminology used is intended to be in a nature of words of description rather than limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. An apparatus for controlling light transmission comprising:

a first polarizer sheet, a first multiplicity of parallel, spaced-apart lines formed of an electro-optic crystal material on said first polarizer sheet, said lines having a pre-set spacing of "X" thereinbetween, a second polarizer sheet on top of said first multiplicity of parallel, spaced-apart lines, a second multiplicity of parallel, spaced-apart lines formed of an electro-optic crystal material on said second polarizer sheet substantially parallel to and overlapping said spacing "X" of said first multiplicity of lines, a third polarizer sheet on top of said multiplicity of lines, a third multiplicity of parallel, spaced-apart lines formed of an electro-optic material and in a perpendicular direction to said first and second multiplicity of lines on said third polarizer sheet, said third multiplicity of lines having a pre-set spacing of "Y" therebetween, a fourth polarizer sheet on top of said third multiplicity of lines, a fourth multiplicity of parallel, spaced-apart lines formed of an electro-optic material on said fourth polarizer sheet substantially parallel to and overlapping said spacing of "Y" of said third plurality of parallel, spaced-apart lines, and a transparent, electrically insulative material embedding said fourth multiplicity of parallel, spaced-apart lines.

2. An apparatus for controlling light transmission according to claim 1 further comprising a transparent, electrically insulative material embedding each of said first, second and third multiplicity of parallel, spaced-apart lines.

3. An apparatus for controlling light transmission according to claim 2, wherein said transparent, electrically insulative material comprises $SiO_2$.

4. An apparatus for controlling light transmission according to claim 1 further comprising electrical wiring means for providing electrical communication with each of said first, second, third and fourth multiplicity of parallel, spaced-apart lines.

5. An apparatus for controlling light transmission according to claim 1 further comprising electrically wiring means, power supply and logic control unit forming a a grating unit for a stepper.

6. An apparatus for controlling light transmission according to claim 1, wherein said electro-optic crystal comprises $LiNbO_3$.

7. An apparatus for controlling light transmission according to claim 1, wherein a width of said first and second multiplicity of parallel, spaced-apart lines is larger than said "X" spacing.

8. An apparatus for controlling light transmission according to claim 1, wherein a width of said first and second multiplicity of parallel, spaced-apart lines is larger than said "X" spacing by at least 10% "X".

9. An apparatus for controlling light transmission according to claim 1, wherein a width of said third and fourth multiplicity of parallel, spaced-apart lines is larger than said "Y" spacing.

10. An apparatus for controlling light transmission according to claim 1, wherein a width of said third and fourth multiplicity of parallel, spaced-apart lines is larger than said "Y" spacing by at least 10% "Y".

11. An apparatus for controlling light transmission according to claim 1, wherein a total planar surface area formed by said first multiplicity of parallel, spaced-apart lines is between about 1 mm×1 mm and about 100 mm×100 mm.

12. An apparatus for controlling light transmission according to claim 1, wherein a width of said first, second, third and fourth multiplicity of parallel, spaced-apart lines is between about 1 $\mu$m and about 100 $\mu$m.

13. An apparatus for controlling light transmission according to claim 1, wherein each of said first, second, third and fourth multiplicity of parallel, spaced-apart lines is controlled by an independent logic circuit.

14. An apparatus for controlling light transmission according to claim 1, wherein said first, second, third and fourth multiplicity of parallel, spaced-apart lines are embedded in a polarizer material layer deposited on a quartz plate.

15. A shutter for exposure control in a stepper used in photolithography comprising:

a light transmission control unit formed by a multiplicity of parallel, spaced-apart lines of an electro-optic crystal embedded in a polarizer material layer deposited on a quartz plate, and an exposure control shutter formed by four light transmission control units stacked together in an up-and-down configuration, the top two control units are stacked in such a way that the multiplicity of parallel, spaced-apart lines in a top-most control unit overlaps spacings between said multiplicity of parallel, spaced-apart lines in a second control unit positioned below said topmost control unit, the bottom two control units are stacked in such a manner that said multiplicity of parallel, spaced-apart lines are perpendicular to said multiplicity of parallel, spaced-apart lines in said top two control units, and the multiplicity of parallel, spaced-apart lines in a third control unit overlaps spacings between said multiplicity of parallel, spaced-apart lines in a fourth control unit.

16. A shutter for exposure control in a stepper according to claim 15, wherein said electro-optic crystal comprises $LiNbO_3$.

17. A shutter for exposure control in a stepper according to claim 15, wherein said multiplicity of parallel, spaced apart lines having a width that is larger than a width of said spacings.

18. A shutter for exposure control in a stepper according to claim 15, wherein said multiplicity of parallel, spaced-apart lines having a width that is larger than a width of said spacings by at least 10% of said spacing width.

19. A shutter for exposure control in a stepper according to claim 15 further comprising electrical wiring means, power supply means and logic control means.

20. A shutter for exposure control in a stepper according to claim 15, wherein said multiplicity of parallel, spaced-apart lines each having a width between about 1 mm and about 100 mm.

21. A method for controlling light transmission comprising the steps of:

providing a shutter formed by a first polarizer sheet, a first multiplicity of parallel, spaced-apart lines of an electro-optic crystal material on said first polarizer sheet, said lines having a pre-set spacing of "X" thereinbetween, a second polarizer sheet on top of said first multiplicity of parallel, spaced-apart lines, a second multiplicity of parallel, spaced-apart lines formed of an electro-optic crystal material on said second polarizer sheet substantially parallel to and overlapping said spacing "X" of said first multiplicity of lines, a third polarizer sheet on top of said second multiplicity of lines, a third multiplicity of parallel, spaced apart lines formed of an electro-optic material and positioned in a perpendicular direction to said first and second multiplicity of lines on said third polarizer sheet, said third multiplicity of lines having a pre-set spacing of "Y" therebetween, a fourth polarizer sheet on top of said third multiplicity of lines, a fourth multiplicity of parallel, spaced-apart lines formed of an electro-optic material on said fourth polarizer sheet substantially parallel to and overlapping said spacing of "Y" of said third plurality of parallel, spaced-apart lines, and a transparent, electrically insulative material embedding said fourth multiplicity of parallel, spaced-apart lines, electrically connecting said first, second, third and fourth multiplicity of parallel, spaced-apart lines to a power supply and a logic control unit, and inputting electrical power to said first, second, third and fourth multiplicity of parallel, spaced-apart lines for controlling light transmission through said shutter.

22. A method for controlling light transmission according to claim 21 further comprising the step of forming said first, second third and fourth multiplicity of spaced-apart lines in $LiNbO_3$.

* * * * *

UNITED STATES PATENT AND TRADEMARK OFFICE
CERTIFICATE OF CORRECTION

PATENT NO. : 6,219,171 B1
DATED : April 17, 2001
INVENTOR(S) : Yong-Shun Liao et al.

It is certified that error appears in the above-identified patent and that said Letters Patent is hereby corrected as shown below:

This certificate supersedes Certificate of Correction issued January 7, 2003, the number was erroneously mentioned and should be vacated since no Certificate of Correction was granted.

Signed and Sealed this

Sixth Day of January, 2004

JAMES E. ROGAN
*Director of the United States Patent and Trademark Office*